(12) United States Patent
Tomida

(10) Patent No.: US 11,296,215 B2
(45) Date of Patent: Apr. 5, 2022

(54) ELECTRICAL COUPLING STRUCTURE, SEMICONDUCTOR DEVICE, AND ELECTRONIC APPARATUS

(71) Applicant: Sony Semiconductor Solutions Corporation, Kanagawa (JP)

(72) Inventor: Kazuyuki Tomida, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 127 days.

(21) Appl. No.: 16/635,617

(22) PCT Filed: Jun. 19, 2018

(86) PCT No.: PCT/JP2018/023175
§ 371 (c)(1),
(2) Date: Jan. 31, 2020

(87) PCT Pub. No.: WO2019/031067
PCT Pub. Date: Feb. 14, 2019

(65) Prior Publication Data
US 2020/0243676 A1 Jul. 30, 2020

(30) Foreign Application Priority Data
Aug. 7, 2017 (JP) .............................. JP2017-152141

(51) Int. Cl.
*H01L 29/76* (2006.01)
*H01L 29/94* (2006.01)
*H01L 31/113* (2006.01)
*H01L 29/78* (2006.01)
*H01L 21/28* (2006.01)
*H01L 29/417* (2006.01)

(52) U.S. Cl.
CPC .............. *H01L 29/78* (2013.01); *H01L 21/28* (2013.01); *H01L 29/417* (2013.01)

(58) Field of Classification Search
CPC . H01L 21/28; H01L 21/285; H01L 21/76831; H01L 21/76843; H01L 23/485; H01L 29/0847; H01L 29/0895; H01L 29/165; H01L 29/401; H01L 29/417; H01L 29/41725; H01L 29/66628; H01L 29/66636; H01L 29/66643; H01L 29/78
USPC ........................................................ 257/288
See application file for complete search history.

(56) References Cited

U.S. PATENT DOCUMENTS

2015/0380309 A1 12/2015 Mujumdar et al.
2016/0343805 A1* 11/2016 Lee .......................... H01L 29/45
(Continued)

FOREIGN PATENT DOCUMENTS

| JP | 2015-090984 A | 5/2015 |
| JP | 2016-219788 A | 12/2016 |
| JP | 2017-117942 A | 6/2017 |

*Primary Examiner* — Theresa T Doan
(74) *Attorney, Agent, or Firm* — Michael Best & Friedrich LLP

(57) ABSTRACT

[Object] To stably form a low-resistance electrical coupling between a metal and a semiconductor.
[Solution] An electrical coupling structure includes: a semiconductor layer; a metal layer; and an intermediate layer that is held between the semiconductor layer and the metal layer, and includes an insulating layer provided on the semiconductor layer side and a two-dimensional material layer provided on the metal layer side.

20 Claims, 10 Drawing Sheets

(56) References Cited

U.S. PATENT DOCUMENTS

2017/0092592 A1 3/2017 Shin et al.
2017/0236968 A1* 8/2017 Heo .................. H01L 31/02161
257/77

* cited by examiner

[ FIG. 1 ]
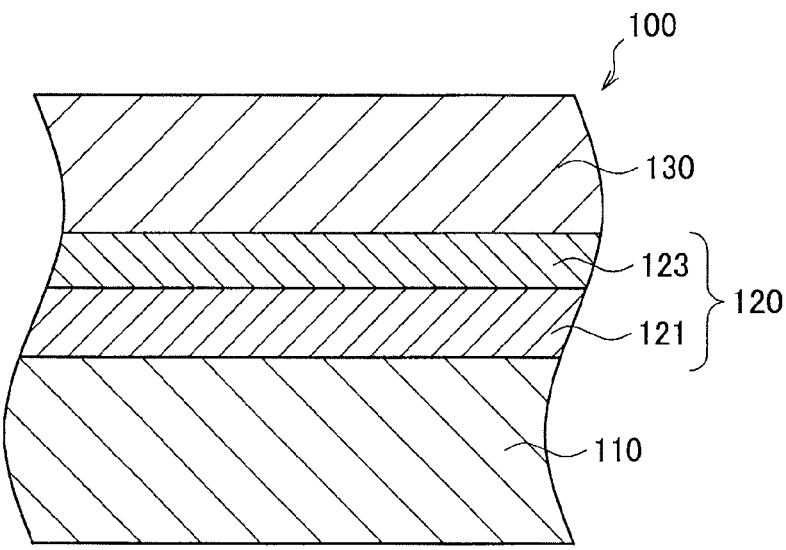
[ FIG. 2A ]
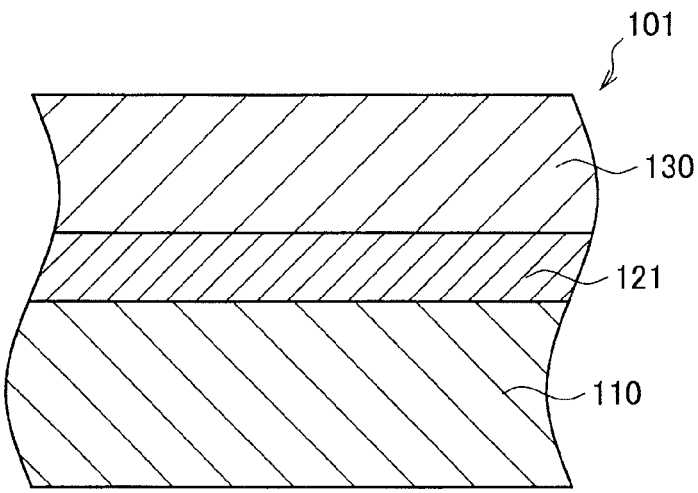
[ FIG. 2B ]
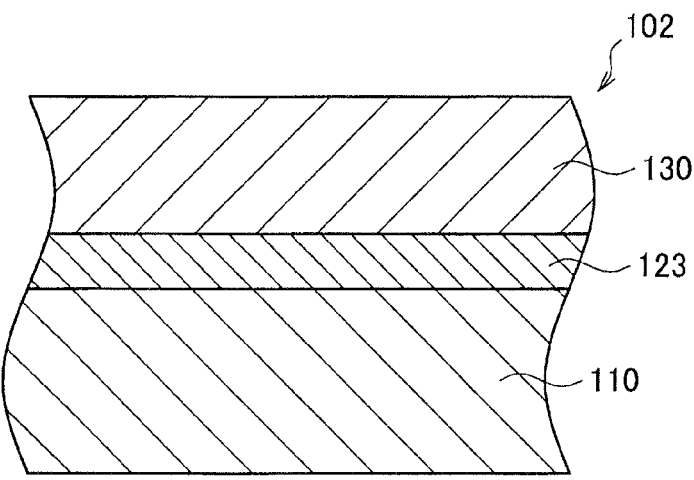

[FIG. 3]
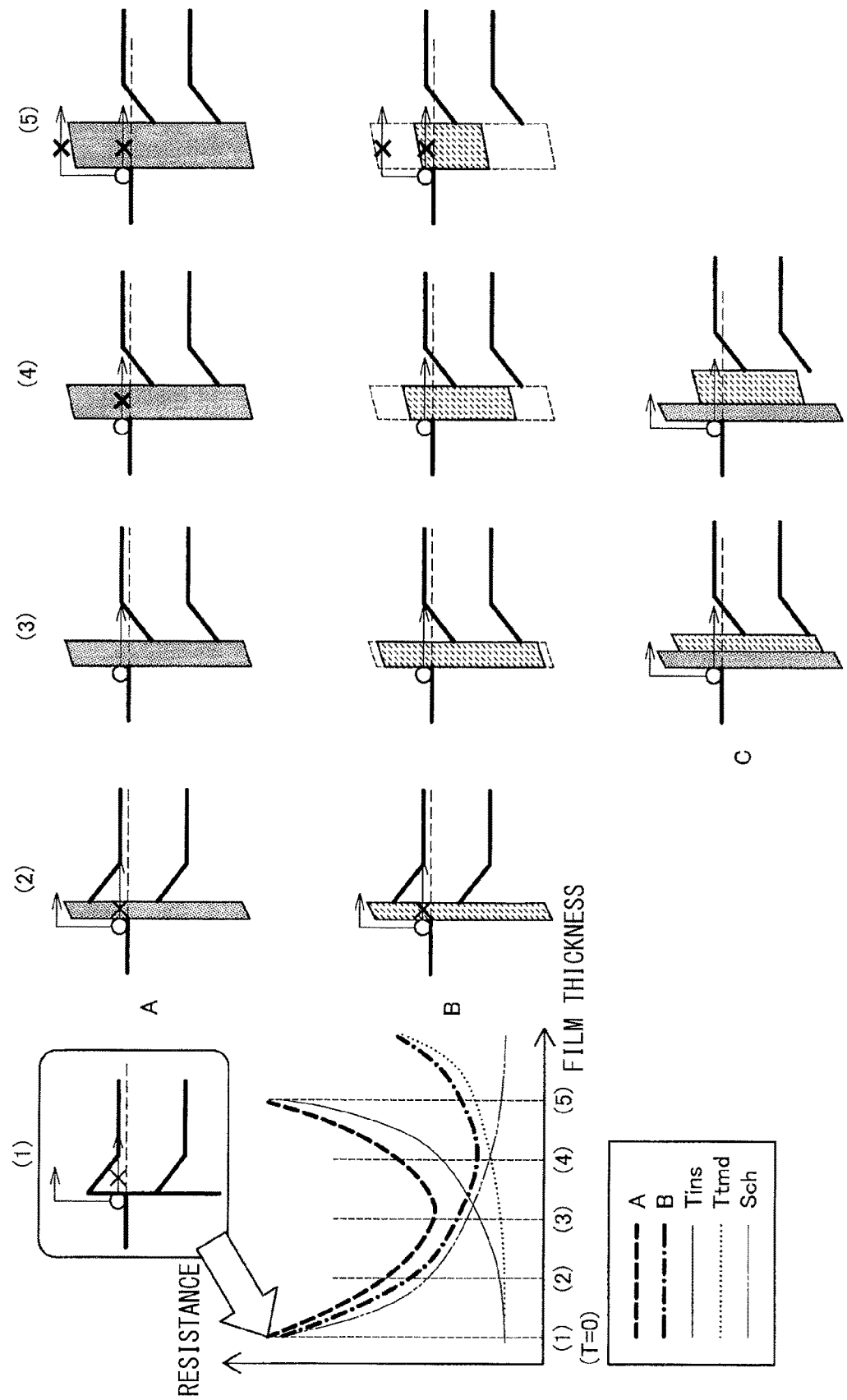

[ FIG. 4 ]
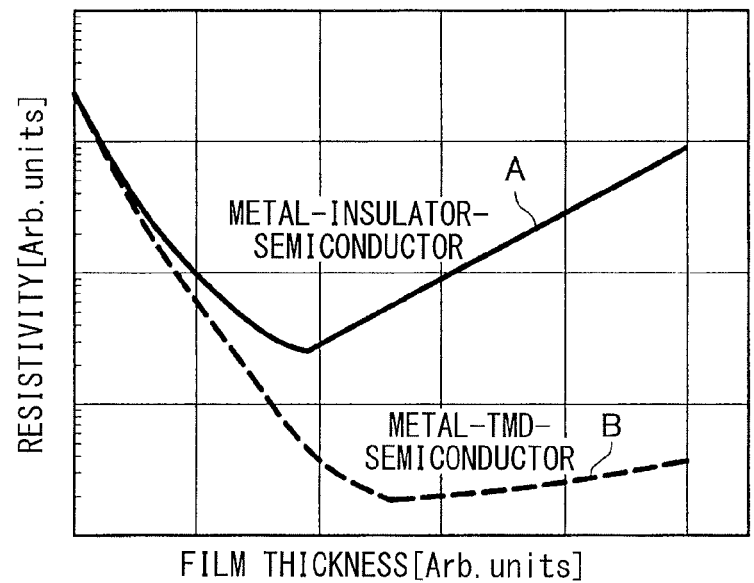
[ FIG. 5 ]
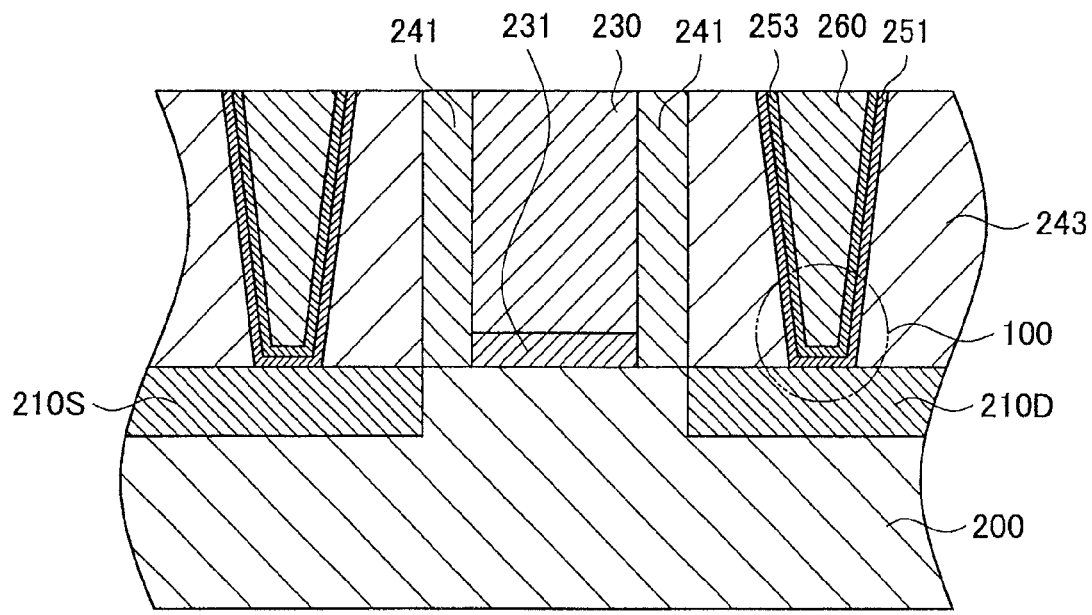

[ FIG. 6A ]
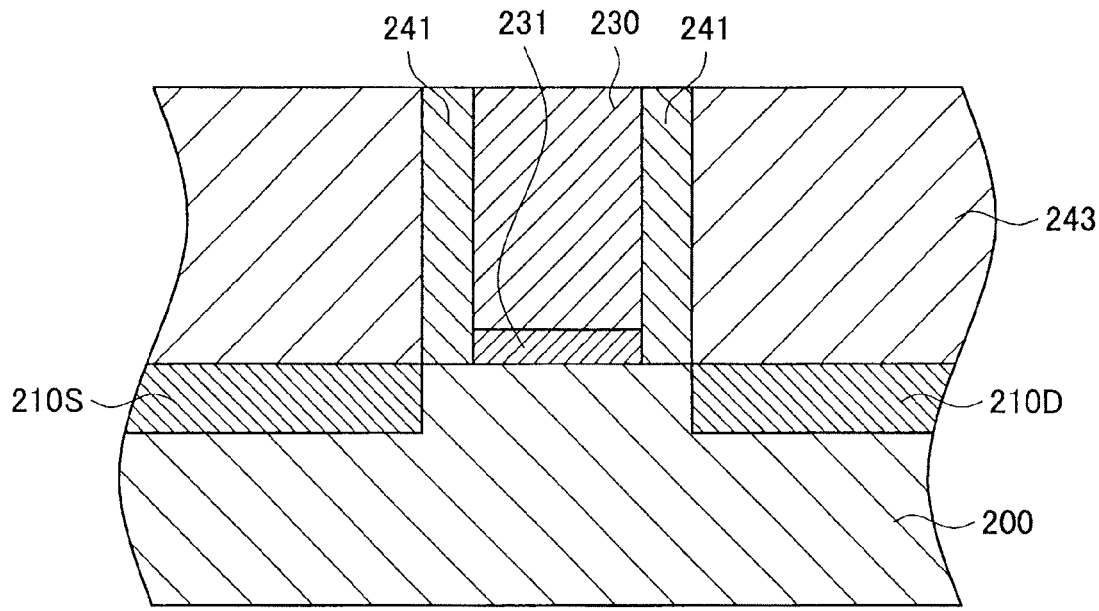
[ FIG. 6B ]
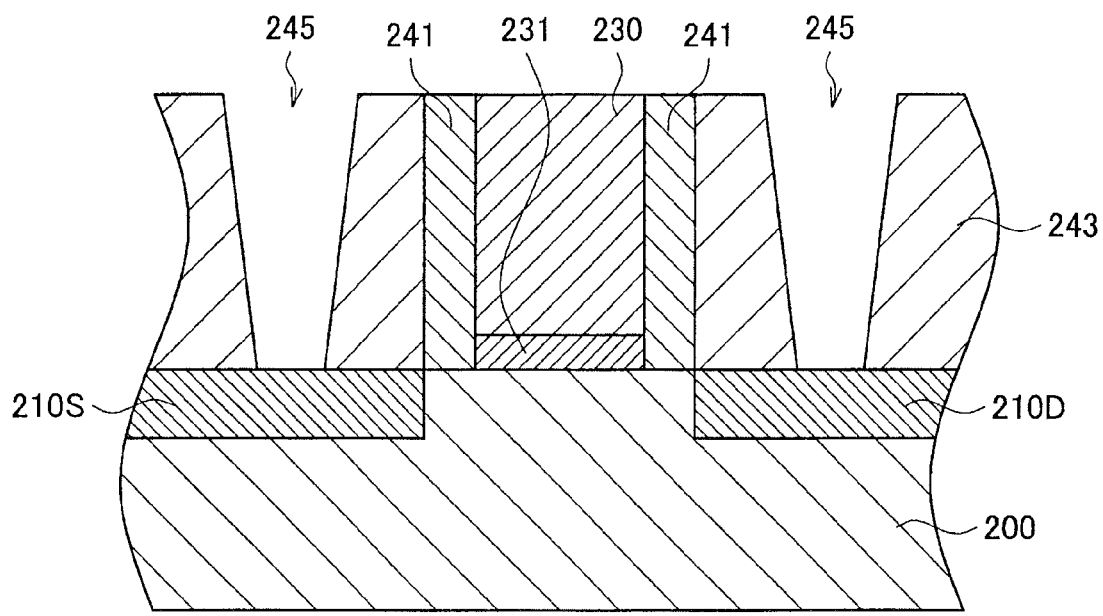

[ FIG. 6C ]
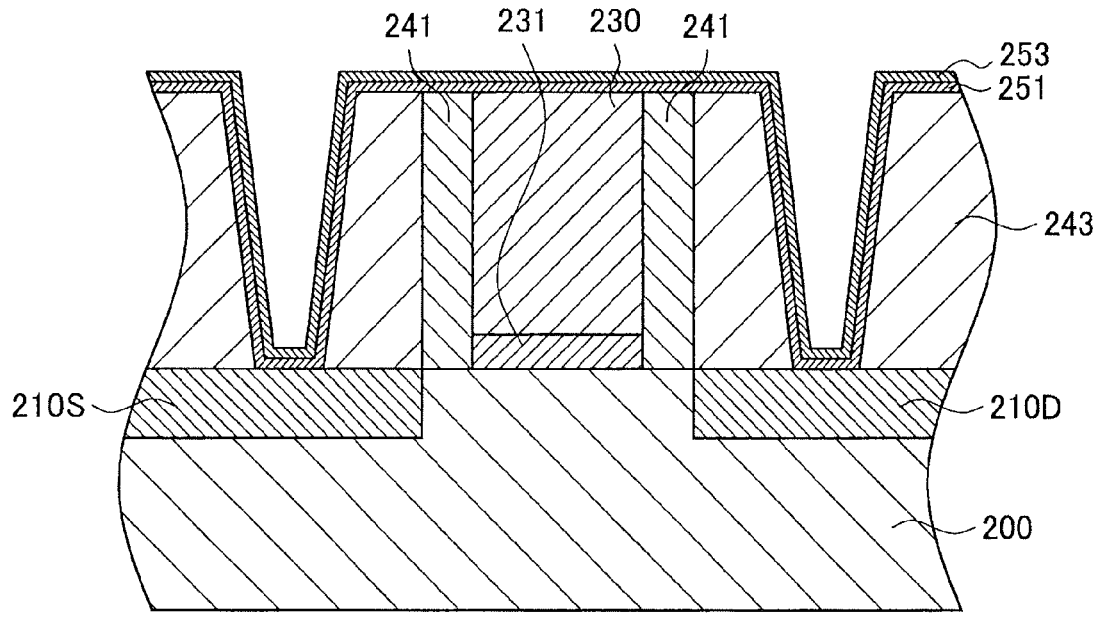
[ FIG. 6D ]
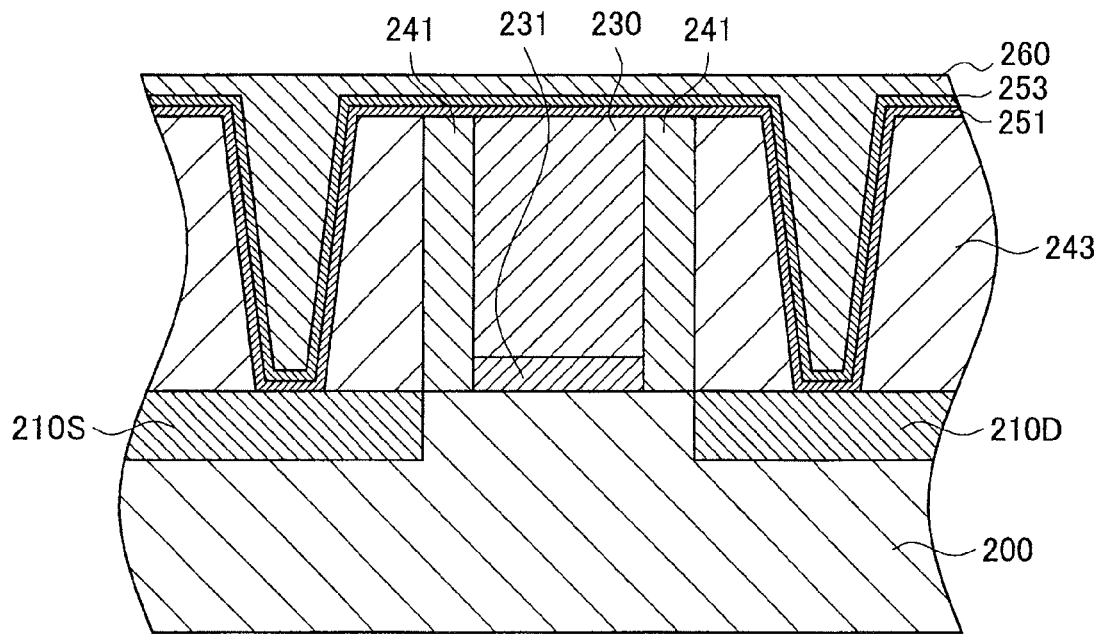

[ FIG. 6E ]
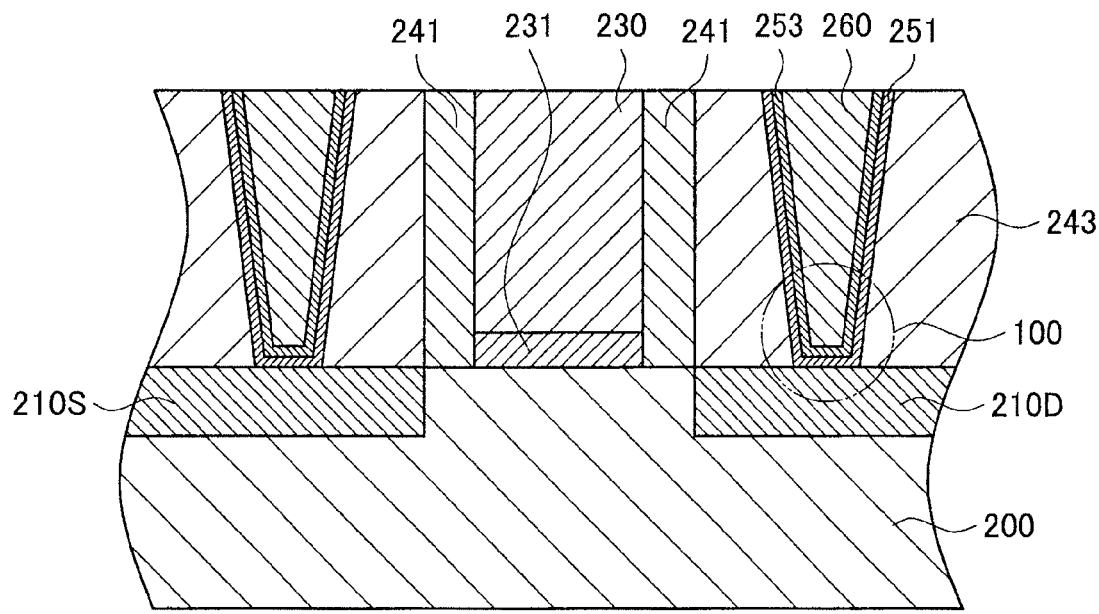
[ FIG. 7A ]
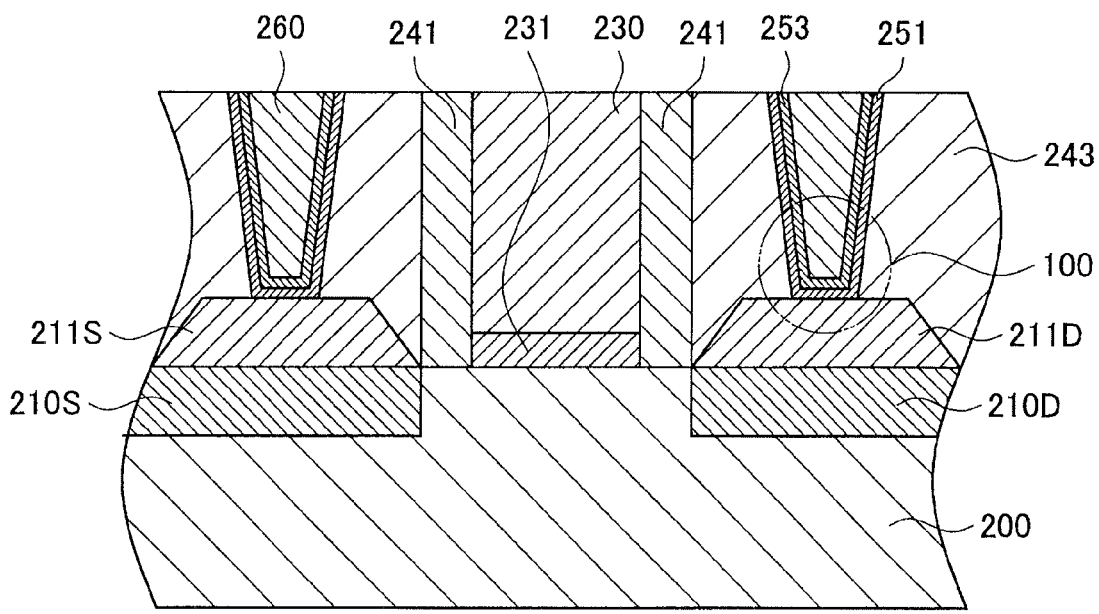

[ FIG. 7B ]
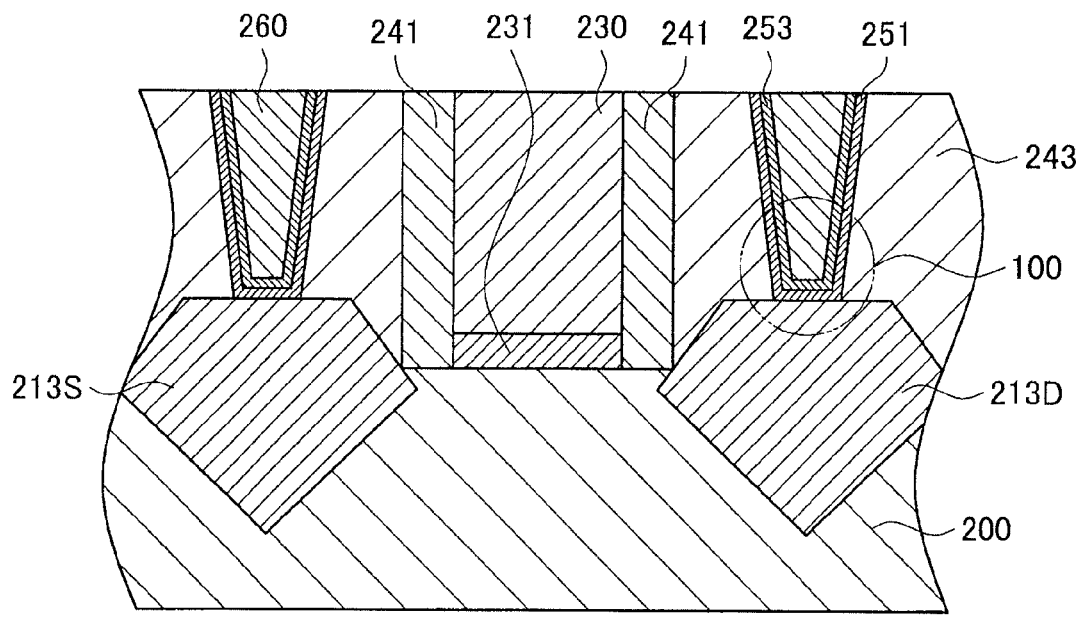
[ FIG. 8 ]
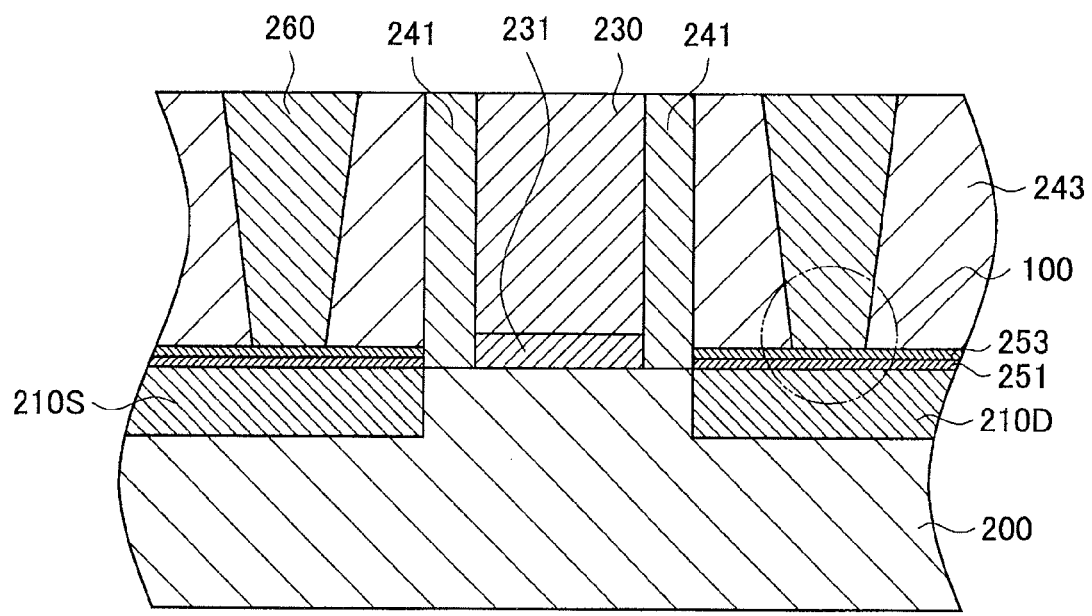

[ FIG. 9A ]
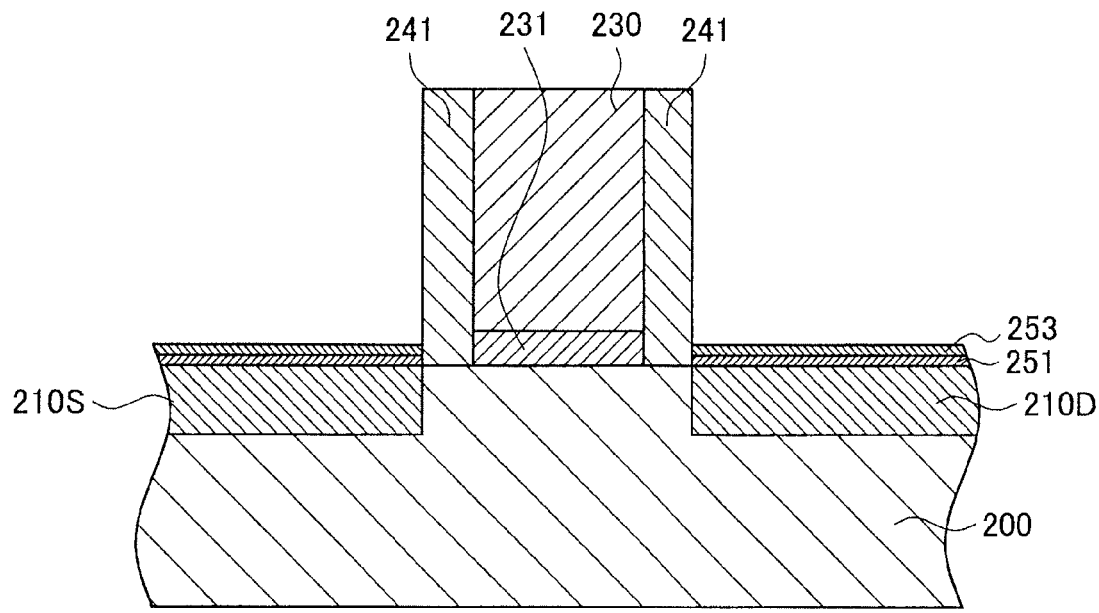
[ FIG. 9B ]
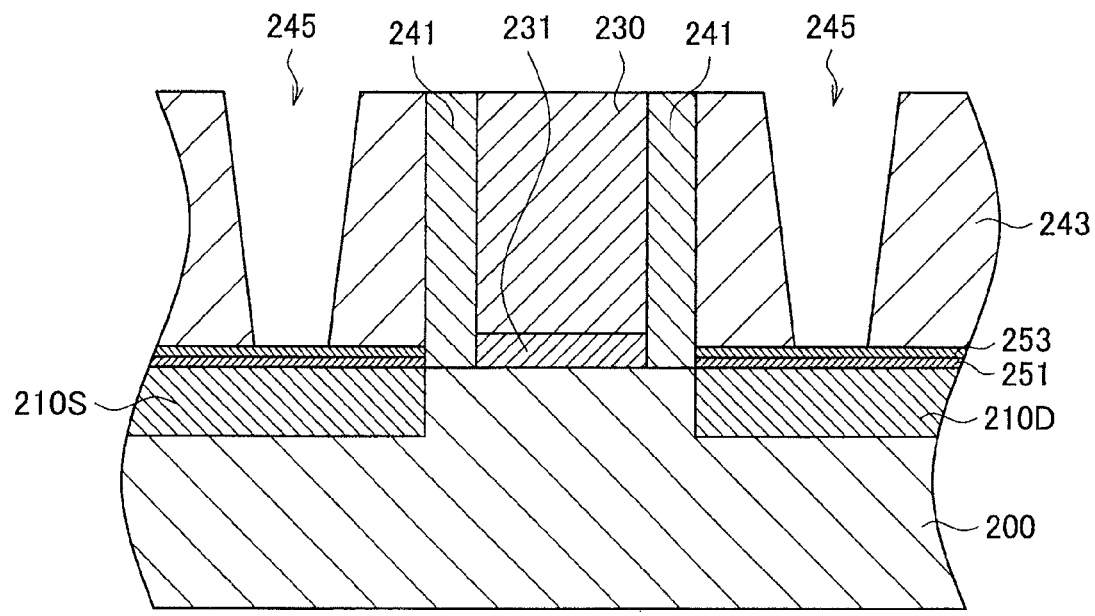

[ FIG. 9C ]
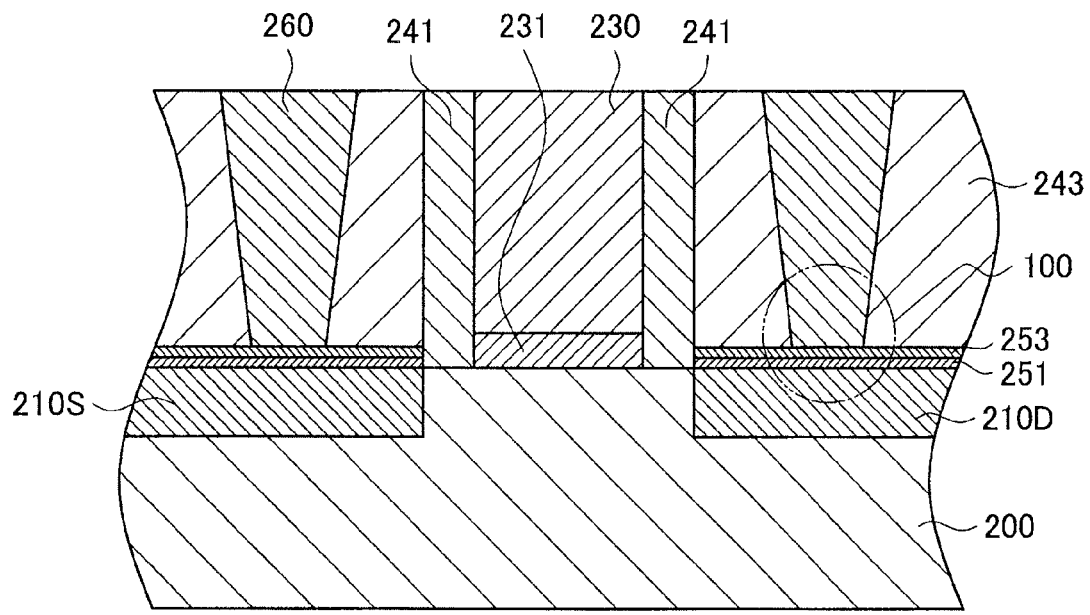
[ FIG. 10A ]
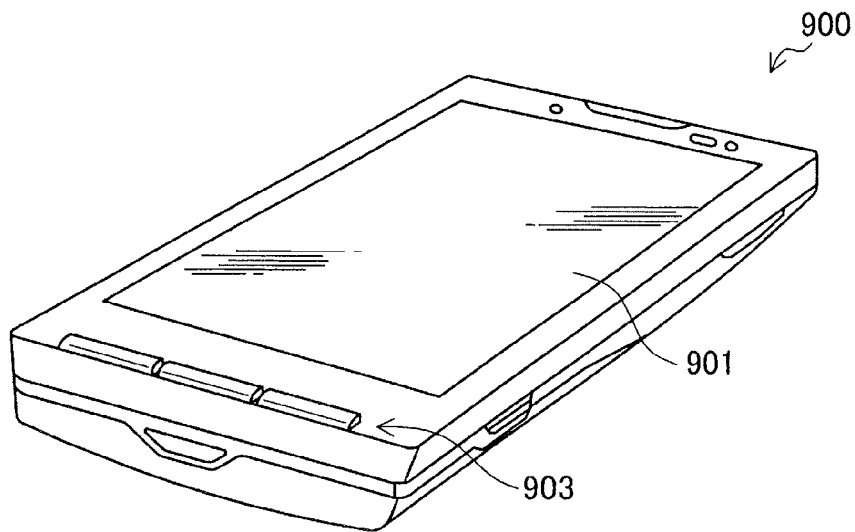

[ FIG. 10B ]
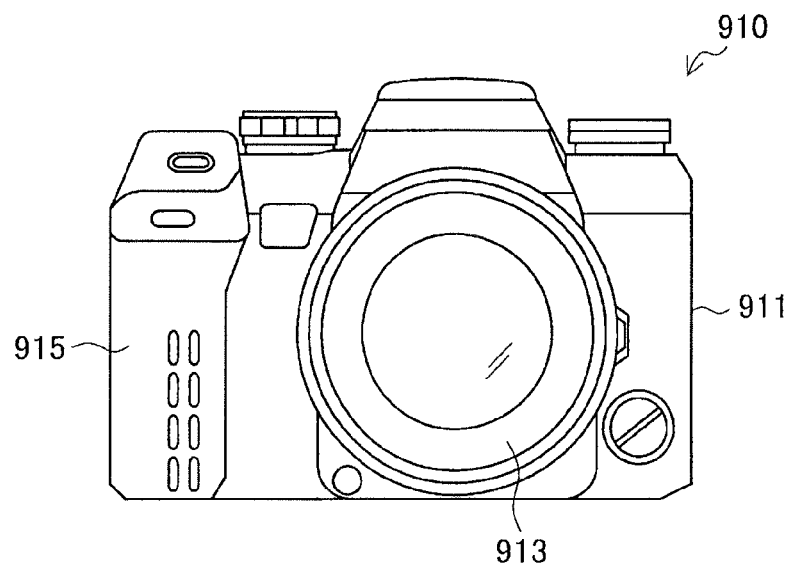
[ FIG. 10C ]
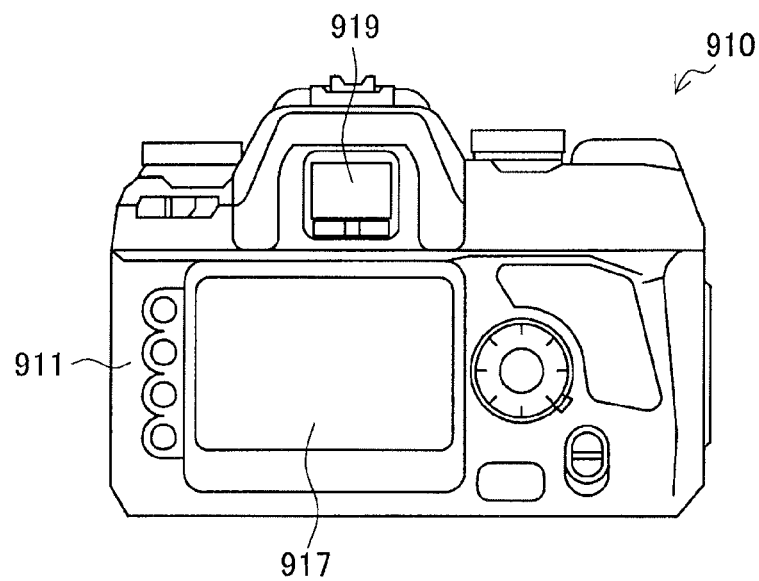

ELECTRICAL COUPLING STRUCTURE, SEMICONDUCTOR DEVICE, AND ELECTRONIC APPARATUS

TECHNICAL FIELD

The present disclosure relates to an electrical coupling structure, a semiconductor device, and an electronic apparatus.

BACKGROUND ART

In recent years, miniaturization of semiconductor devices such as a solid-state imaging device and an integrated circuit has been advancing. Thus, as for a contact structure that electrically couples a metal, such as an electrode or a wiring line, and a semiconductor, such as a well, reduction of a coupling area has been advancing.

Accordingly, to reduce a contact resistance between different kinds of materials such as a metal and a semiconductor, for example, a metal-insulator-semiconductor (MIS) contact technology has been proposed. In the MIS contact technology, an ultrathin insulator is provided between the metal and the semiconductor, which makes it possible to reduce a Schottky resistance caused by direct bonding of the metal and the semiconductor.

Meanwhile, as described in below-mentioned PTL 1, a two-dimensional material such as graphene has drawn attention in recent years. The two-dimensional material has a layered structure in which unit layers each having a two-dimensional structure are stacked, and has a specific property depending on the layered structure, and therefore has drawn attention as a next-generation material that may produce a breakthrough in a semiconductor device.

CITATION LIST

Patent Literature

PTL 1: Japanese Unexamined Patent Application Publication No. 2015-90984

SUMMARY OF THE INVENTION

Problem to be Solved by the Invention

Here, in the above-described MIS contact technology, in a case where a film thickness of the insulator between the metal and the semiconductor is excessively thick, a current loss is caused by a tunnel resistance. Furthermore, in a case where the film thickness of the insulator between the metal and the semiconductor is excessively thin, it fails to obtain an effect of reducing the Schottky resistance. That is, in the above-described MIS contact technology, there is a large variation in resistance due to a variation in the film thickness of the insulator; therefore, it is difficult to stably reduce a contact resistance of the metal and the semiconductor.

Accordingly, a lower-resistance and stable coupling structure has been desired of a coupling structure of a metal and a semiconductor. There is a possibility that such a coupling structure may be realized by application of knowledge in a recently developed next-generation material.

Therefore, the present disclosure proposes a novel and improved electrical coupling structure that makes it possible to stably form a low-resistance coupling structure between a metal and a semiconductor, and a semiconductor device and an electronic apparatus that include the coupling structure.

Means for Solving the Problem

According to the present disclosure, there is provided an electrical coupling structure including: a semiconductor layer; a metal layer; and an intermediate layer that is held between the semiconductor layer and the metal layer, and includes an insulating layer provided on the semiconductor layer side and a two-dimensional material layer provided on the metal layer side.

Furthermore, according to the present disclosure, there is provided a semiconductor device including a contact structure that electrically couples a semiconductor layer and a metal layer to each other. The contact structure includes an intermediate layer held between the semiconductor layer and the metal layer, and the intermediate layer includes an insulating layer provided on the semiconductor layer side and a two-dimensional material layer provided on the metal layer side.

There is provided an electronic apparatus including a contact structure that electrically couples a semiconductor layer and a metal layer to each other. The contact structure includes an intermediate layer held between the semiconductor layer and the metal layer, and the intermediate layer includes an insulating layer provided on the semiconductor layer side and a two-dimensional material layer provided on the metal layer side.

According to the present disclosure, it is possible to extend a range of the film thickness of the intermediate layer, which makes it possible to reduce a contact resistance between a metal and a semiconductor, to the side of a thicker film. Therefore, according to the present disclosure, it is possible to make a process margin at the time of deposition of the intermediate layer larger.

Effects of the Invention

As described above, according to the present disclosure, it is possible to stably form a low-resistance coupling structure between a metal and a semiconductor.

It is to be noted that the above-described effects are not necessarily limitative; along with the above-described effects, or instead of the above-described effects, any of effects described in the present specification or other effects that may be grasped from the present specification may be achieved.

BRIEF DESCRIPTION OF DRAWINGS

FIG. 1 is a schematic cross-sectional view that describes a configuration of an electrical coupling structure according to a first embodiment of the present disclosure.

FIG. 2A is a schematic longitudinal cross-sectional view of an electrical coupling structure through only an insulating layer.

FIG. 2B is a schematic longitudinal cross-sectional view of an electrical coupling structure through only a two-dimensional material layer.

FIG. 3 is an explanatory diagram illustrating a relationship between a film thickness of a layer held between a semiconductor layer and a metal layer and a resistance of a coupling structure in each of the electrical coupling structures illustrated in FIGS. 1 to 2B.

FIG. 4 is a graph chart illustrating a result confirmed through an actual simulation of the relationship between the film thickness of the layer held between the semiconductor layer and the metal layer and the resistance of the coupling structure schematically illustrated in a graph of FIG. 3.

FIG. 5 is a longitudinal cross-sectional view schematically illustrating a first structure example of a semiconductor device according to a second embodiment of the present disclosure.

FIG. 6A is a schematic longitudinal cross-sectional view that describes one of steps of manufacturing the semiconductor device according to the structure example.

FIG. 6B is a schematic longitudinal cross-sectional view that describes one of the steps of manufacturing the semiconductor device according to the structure example.

FIG. 6C is a schematic longitudinal cross-sectional view that describes one of the steps of manufacturing the semiconductor device according to the structure example.

FIG. 6D is a schematic longitudinal cross-sectional view that describes one of the steps of manufacturing the semiconductor device according to the structure example.

FIG. 6E is a schematic longitudinal cross-sectional view that describes one of the steps of manufacturing the semiconductor device according to the structure example.

FIG. 7A is a longitudinal cross-sectional view illustrating a modification example of the semiconductor device according to the structure example.

FIG. 7B is a longitudinal cross-sectional view illustrating another modification example of the semiconductor device according to the structure example.

FIG. 8 is a longitudinal cross-sectional view schematically illustrating a second structure example of the semiconductor device according to the second embodiment of the present disclosure.

FIG. 9A is a schematic longitudinal cross-sectional view that describes one of steps of manufacturing the semiconductor device according to the structure example.

FIG. 9B is a schematic longitudinal cross-sectional view that describes one of the steps of manufacturing the semiconductor device according to the structure example.

FIG. 9C is a schematic longitudinal cross-sectional view that describes one of the steps of manufacturing the semiconductor device according to the structure example.

FIG. 10A is an appearance view of an example of an electronic apparatus to which the semiconductor device according to the second embodiment of the present disclosure is applicable.

FIG. 10B is an appearance view of another example of the electronic apparatus to which the semiconductor device according to the embodiment is applicable.

FIG. 10C is an appearance view of still another example of the electronic apparatus to which the semiconductor device according to the embodiment is applicable.

MODES FOR CARRYING OUT THE INVENTION

In the following, some preferred embodiments of the present disclosure are described in detail with reference to accompanying drawings. It is to be noted that in the present specification and the drawings, components having substantially the same functional configuration are assigned the same reference numeral, and thereby repetition of description is omitted.

It is to be noted that in the drawings referred to in the following description, for convenience of description, some of constituent members may be exaggerated in size. Therefore, the relative sizes of constituent members illustrated in each drawing do not necessarily represent an exact size relation among actual constituent members. Furthermore, in the following description, a direction in which substrates or layers are stacked may be referred to as an upper direction.

It is to be noted that description is given in the following order.
1. First Embodiment
   1.1. Configuration of Present Embodiment
   1.2. Working Mechanism of Present Embodiment
2. Second Embodiment
   2.1. First Structure Example
   2.2. Second Structure Example
3. Application Examples 1. First Embodiment (1.1. Configuration of Present Embodiment)

First, a configuration of an electrical coupling structure according to a first embodiment of the present disclosure is described with reference to FIG. 1. FIG. 1 is a schematic cross-sectional view that describes the configuration of the electrical coupling structure according to the first embodiment of the present disclosure.

As illustrated in FIG. 1, an electrical coupling structure 100 according to the present embodiment is a coupling structure that electrically couples a semiconductor layer 110 and a metal layer 130 through an intermediate layer 120 including an insulating layer 121 and a two-dimensional material layer 123.

The semiconductor layer 110 is, for example, a functional layer that realizes a function, such as amplification, rectification, switching, light emission, or photoelectric conversion, in a semiconductor device. The semiconductor layer 110 may include either an elemental semiconductor that alone serves as a semiconductor or a compound semiconductor that is made to serve as a semiconductor by multiple atoms being ionically bonded. Furthermore, an impurity of some conductivity type may be introduced into the semiconductor layer 110. For example, a p-type impurity, such as boron (B) or aluminum (Al), or an n-type impurity, such as phosphorus (P) or arsenic (As), may be introduced into the semiconductor layer 110. It is to be noted that in a case where an impurity of some conductivity type is introduced into the semiconductor layer 110, the concentration of the impurity of some conductivity type may be either low concentration or high concentration.

Examples of the elemental semiconductor may include Group IV semiconductors such as Si and Ge. Examples of the compound semiconductor may include Group III-V compounds such as GaAs, GaN, and InP, Group IV compound semiconductors such as SiC and SiGe, and Group II-VI semiconductors such as ZnSe, CdS, and ZnO.

The metal layer 130 serves as, for example, a wiring line or an electrode that transmits an electric current or a signal in the semiconductor device. The metal layer 130 may include a single metal material, or may include a stacked structure of multiple metal materials, for example. As the metal material(s) included in the metal layer 130, for example, metal materials such as W, Cu, Ti, Al, Pt, and Au or metal compounds such as TiN and TaN may be used.

The electrical coupling structure 100 according to the present embodiment forms a resistance-reduced, appropriate coupling structure between the semiconductor layer 110 and the metal layer 130 that include different kinds of materials from each other. According to the present embodiment, it is possible to electrically couple the semiconductor layer 110 including any semiconductor material and the metal layer 130 including any metal material with low resistance.

The intermediate layer 120 is an ultrathin-film layer held between the semiconductor layer 110 and the metal layer 130.

Here, in a case where the semiconductor layer 110 and the metal layer 130 are directly bonded, at a bonded interface of the semiconductor layer 110 and the metal layer 130, a wave function of electrons of the metal layer 130 penetrates into the semiconductor layer 110, which leads to the occurrence of a phenomenon called Fermi-level pinning (FLP) that an apparent work function of a metal material increases. Thus, in the case where the semiconductor layer 110 and the metal layer 130 are directly bonded, due to a Schottky barrier, the resistance between the semiconductor layer 110 and the metal layer 130 becomes high.

In the electrical coupling structure 100 according to the present embodiment, the intermediate layer 120 is provided between the semiconductor layer 110 and the metal layer 130, which makes it possible to suppress the occurrence of FLP and reduce the resistance between the semiconductor layer 110 and the metal layer 130.

In the present embodiment, the intermediate layer 120 includes the insulating layer 121 provided on the semiconductor layer 110 side and the two-dimensional material layer 123 provided on the metal layer 130 side. Specifically, the intermediate layer 120 may be formed by sequentially stacking the insulating layer 121 and the two-dimensional material layer 123 from the semiconductor layer 110 side toward the metal layer 130 side. According to such a configuration, even in a case where the intermediate layer 120 including an ultrathin film varies in film thickness, the electrical coupling structure 100 according to the present embodiment makes it possible to stably reduce the resistance between the semiconductor layer 110 and the metal layer 130.

Of the intermediate layer 120, the insulating layer 121 is provided on the side in contact with the semiconductor layer 110, and the two-dimensional material layer 123 is provided on the side in contact with the metal layer 130. Specifically, the insulating layer 121 is provided on the semiconductor layer 110, and the two-dimensional material layer 123 is provided on the insulating layer 121. Furthermore, the metal layer 130 is provided on the two-dimensional material layer 123.

The insulating layer 121 is provided to enhance the bonding of the semiconductor layer 110 and the two-dimensional material layer 123. A two-dimensional material included in the two-dimensional material layer 123 tends to bond to an insulator rather than a semiconductor. Thus, the two-dimensional material layer 123 may be formed on the insulating layer 121 more easily than on the semiconductor layer 110.

It is to be noted that the insulating layer 121 may be provided between the two-dimensional material layer 123 and the metal layer 130. In such a case, the insulating layer 121 is able to enhance the bonding of the two-dimensional material layer 123 and the metal layer 130.

The insulating layer 121 may include an insulating oxide material. For example, the insulating layer 121 may include an oxide of transition metal, base metal or semimetal, or a mixture of these. Examples of a transition metal oxide may include $TiO_2$, $HfO_2$, $ZrO_2$, $Sc_2O_3$, $Y_2O_3$, $La_2O_3$, $Ta_2O_5$, and the like. Examples of a base metal oxide or a semimetal oxide may include $Al_2O_3$, $Ga_2O_3$, $SiO_2$, $GeO_2$, and the like. Examples of an oxide of a mixture of transition metal, base metal or semimetal may include HfSiO and the like.

In a case where the insulating layer 121 includes the transition metal oxide, the transition metal oxide has a relatively small band gap, and thus the insulating layer 121 is able to further increase a tunnel current and further reduce the resistance. Furthermore, the transition metal oxide is thermally stable even if it is in contact with the semiconductor layer 110, and thus the insulating layer 121 is able to further stabilize the coupling structure of the semiconductor layer 110 and the metal layer 130.

The insulating layer 121 may have a film thickness of, for example, 0.1 nm or more but not exceeding 3.0 nm. In a case where the film thickness of the insulating layer 121 is less than 0.1 nm, it becomes difficult to form the insulating layer 121 as a form of a film. Furthermore, in a case where the film thickness of the insulating layer 121 exceeds 3.0 nm, the entire film thickness of the intermediate layer 120 becomes thick, thus a tunnel resistance becomes high, and the resistance between the semiconductor layer 110 and the metal layer 130 becomes high. To make the electrical coupling structure 100 low in resistance more stably, the film thickness of the insulating layer 121 may be, for example, 0.5 nm or more but not exceeding 1.0 nm.

The two-dimensional material layer 123 includes a two-dimensional material having a layered structure in which unit layers each having a two-dimensional structure are stacked. The two-dimensional material has a characteristic that the size of a band gap becomes smaller as the number of stacked unit layers increases (i.e., the film thickness increases). The intermediate layer 120 includes the two-dimensional material layer 123 including the two-dimensional material having such a characteristic, and therefore is able to mitigate an increase in the tunnel resistance associated with an increase in the film thickness. Consequently, the intermediate layer 120 including the two-dimensional material layer 123 makes it possible to raise the upper limit of a film thickness range that allows the realization of a low resistance state between the semiconductor layer 110 and the metal layer 130.

The two-dimensional material included in the two-dimensional material layer 123 is a material having a layered structure in which unit layers each having a two-dimensional structure are stacked. Specifically, examples of the two-dimensional material included in the two-dimensional material layer 123 may include a monoatomic layered substance or its similar compound, transition metal dichalcogenide, and the like.

Examples of the monoatomic layered substance or its similar compound include graphene, black phosphorus, silicene, hexagonal boron nitride (hBN), and the like. These substances or compounds have a structure in which monolayers each having a two-dimensional crystal structure made by a covalent bond are stacked and bonded to each other by van der Waals force.

The transition metal dichalcogenide is specifically a material represented by a chemical formula $MX_2$. Here, M is a transition metal element such as Sc, Ti, V, Cr, Mn, Fe, Co, Ni, Cu, Ge, Zr, Nb, Mo, Ru, Rh, Pd, Sn, Hf, Ta, W, Re, Os, Ir, Pt, Au, Hg, or Pb; and X is a chalcogenide element such as S, Se, or Te. More specifically, the two-dimensional material included in the two-dimensional material layer 123 may be any of $CrS_2$, $CrSe_2$, $CrTe_2$, $HfS_2$, $HfSe_2$, $HfTe_2$, $MoS_2$, $MoSe_2$, $MoTe_2$, $NiS_2$, $NiSe_2$, $SnS_2$, $SnSe_2$, $TiS_2$, $TiSe_2$, $TiTe_2$, $WS_2$, $WSe_2$, $ZrS_2$, $ZrSe_2$, and $ZrTe_2$.

In a case where the two-dimensional material layer 123 includes the above-described transition metal dichalcogenide, the transition metal dichalcogenide is able to be deposited by means of atomic layer deposition (ALD), chemical vapor deposition (CVD), phisical vapor deposition (PVD), or the like, which makes it possible to more easily form the coupling structure of the semiconductor layer 110 and the metal layer 130.

Furthermore, in a case where the two-dimensional material layer 123 includes the transition metal dichalcogenide, by taking into consideration respective characteristics of the materials included in the semiconductor layer 110 and the metal layer 130, it becomes possible to select a material of the two-dimensional material layer 123 to allow a more appropriate electrical coupling structure to be formed.

For example, as X changes in the order of S, Se, and Te, a conduction band of the transition metal dichalcogenide represented by the chemical formula $MX_2$ shifts to a shallower energy region. Therefore, in a case where respective Fermi levels of the materials included in the semiconductor layer 110 and the metal layer 130 are deep (for example, in a case where the metal material is Pt, Ni, Au, or the like), a material represented by $MS_2$ (i.e., X=S) may be used as the transition metal dichalcogenide included in the two-dimensional material layer 123. In such a case, it is possible to bring the respective Fermi levels of the materials included in the semiconductor layer 110 and the metal layer 130 and the level of an energy region where the conduction band of the transition metal dichalcogenide included in the two-dimensional material layer 123 exists closer.

As described above, a two-dimensional material has the characteristic that a band gap becomes smaller as the number of stacked unit layers increases. However, in a case where the number of the stacked unit layers of the two-dimensional material layer 123 exceeds ten, the entire film thickness of the intermediate layer 120 becomes thick, thus the tunnel resistance becomes high beyond reduction in the resistance caused by a decrease in the band gap, and the resistance between the semiconductor layer 110 and the metal layer 130 becomes high. Therefore, the upper limit of the number of the stacked unit layers of the two-dimensional material layer 123 may be set to ten, and the range of the number of the stacked unit layers of the two-dimensional material layer 123 may be set to one or more but not exceeding ten. It is to be noted that the unit layer of the two-dimensional material layer 123 represents one repetitive cycle of atoms forming the two-dimensional structure of the two-dimensional material.

Furthermore, the two-dimensional material layer 123 may have a film thickness of 0.5 nm or more but not exceeding 5.0 nm. In a case where the film thickness of the two-dimensional material layer 123 is less than 0.5 nm, the two-dimensional material layer 123 becomes an excessively thin film, and thus there is a possibility that the unit layers of the two-dimensional material layer 123 may not be formed. Moreover, in a case where the film thickness of the two-dimensional material layer 123 exceeds 5.0 nm, the entire film thickness of the intermediate layer 120 becomes thick, thus the tunnel resistance becomes high, and there is a possibility that the resistance between the semiconductor layer 110 and the metal layer 130 may become high.

Furthermore, the total film thickness of the intermediate layer 120 may be 0.6 nm or more but not exceeding 5.0 nm. In a case where the film thickness of the intermediate layer 120 is less than 0.6 nm, there is a possibility that the wave function of electrons of the metal layer 130 may not be prevented from penetrating to the semiconductor layer 110 side, and FLP may not be unpinned. Moreover, in a case where the film thickness of the intermediate layer 120 exceeds 5.0 nm, the entire film thickness of the intermediate layer 120 becomes thick, thus the tunnel resistance becomes high, and there is a possibility that the resistance between the semiconductor layer 110 and the metal layer 130 may become high.

According to such a configuration, the electrical coupling structure 100 according to the present embodiment makes it possible to electrically couple different kinds of materials that are the semiconductor layer 110 and the metal layer 130 with lower resistance.

Furthermore, in the electrical coupling structure 100 according to the present embodiment, the intermediate layer 120 held between the semiconductor layer 110 and the metal layer 130 is able to maintain the low resistance state without increasing the tunnel resistance even if it has a thicker film thickness. Therefore, the electrical coupling structure 100 makes it possible to prevent the resistance state from being changed due to variation in the film thickness of the intermediate layer 120, and also possible to increase a process margin at the time of formation of the intermediate layer 120.

Specifically, it is possible to extend the range of the optimal film thickness of the intermediate layer 120 by about 1 nm to 2 nm, which makes it possible to make the process margin at the time of formation of the intermediate layer 120 larger. For example, as described above, in a case where the film thickness of the intermediate layer 120 is from 0.6 nm to 5.0 nm, according to the present embodiment, it is possible to expand a margin for the film thickness of the intermediate layer 120 by about 40% to 100%.

Therefore, the electrical coupling structure 100 according to the present embodiment makes it possible to electrically couple the semiconductor layer 110 and the metal layer 130 more stably.

(1.2. Working Mechanism of Present Embodiment)

Subsequently, a working mechanism that allows the semiconductor layer 110 and the metal layer 130 to be electrically coupled with low resistance is described with reference to a coupling structure according to another structure example.

FIG. 2A is a schematic longitudinal cross-sectional view of an electrical coupling structure that couples the semiconductor layer 110 and the metal layer 130 through only an insulating layer, and FIG. 2B is a schematic longitudinal cross-sectional view of an electrical coupling structure that couples the semiconductor layer 110 and the metal layer 130 through only a two-dimensional material layer.

First, as illustrated in FIG. 2A, an electrical coupling structure 101 is a so-called MIS contact structure in which only the insulating layer 121 is held between the semiconductor layer 110 and the metal layer 130.

The semiconductor layer 110 and the metal layer 130 are substantially similar to those of the electrical coupling structure 100 illustrated in FIG. 1, and thus their description is omitted here.

The insulating layer 121 may include an oxide of transition metal, base metal or semimetal, or a mixture of these. Examples of a transition metal oxide may include $TiO_2$, $HfO_2$, $ZrO_2$, $Sc_2O_3$, $Y_2O_3$, $La_2O_3$, $Ta_2O_5$, and the like. Examples of a base metal oxide or a semimetal oxide may include $Al_2O_3$, $Ga_2O_3$, $SiO_2$, $GeO_2$, and the like. Examples of an oxide of a mixture of transition metal, base metal or semimetal may include HfSiO and the like.

Furthermore, as illustrated in FIG. 2B, an electrical coupling structure 102 is a contact structure in which only the two-dimensional material layer 123 is held between the semiconductor layer 110 and the metal layer 130.

The semiconductor layer 110 and the metal layer 130 are substantially similar to those of the electrical coupling structure 100 illustrated in FIG. 1, and thus their description is omitted here.

The two-dimensional material layer 123 includes a two-dimensional material having a layered structure in which unit layers each having a two-dimensional structure are stacked. The two-dimensional material included in the two-dimensional material layer 123 is a material having a layered structure in which unit layers each having a two-dimensional structure are stacked. The two-dimensional material included in the two-dimensional material layer 123 may be specifically a monoatomic layered substance or its similar compound, transition metal dichalcogenide, or the like.

The transition metal dichalcogenide is specifically a material represented by a chemical formula $MX_2$. Here, M is a transition metal element such as Sc, Ti, V, Cr, Mn, Fe, Co, Ni, Cu, Ge, Zr, Nb, Mo, Ru, Rh, Pd, Sn, Hf, Ta, W, Re, Os, Ir, Pt, Au, Hg, or Pb; and X is a chalcogenide element such as S, Se, or Te. More specifically, the two-dimensional material included in the two-dimensional material layer 123 may be any of $CrS_2$, $CrSe_2$, $CrTe_2$, $HfS_2$, $HfSe_2$, $HfTe_2$, $MoS_2$, $MoSe_2$, $MoTe_2$, $NiS_2$, $NiSe_2$, $SnS_2$, $SnSe_2$, $TiS_2$, $TiSe_2$, $TiTe_2$, $WS_2$, $WSe_2$, $ZrS_2$, $ZrSe_2$, and $ZrTe_2$.

Here, with respect to each of the electrical coupling structure 100 according to the present embodiment and the above-described electrical coupling structures 101 and 102, a relationship between the film thickness of the layer held between the semiconductor layer 110 and the metal layer 130 and the resistance of the coupling structure is described with reference to FIG. 3. FIG. 3 is an explanatory diagram illustrating the relationship between the film thickness of the layer held between the semiconductor layer and the metal layer and the resistance of the coupling structure in each of the electrical coupling structures illustrated in FIGS. 1 to 2B.

In FIG. 3, a schematic diagram of an energy diagram of the electrical coupling structure 101 using only the insulating layer 121 is illustrated as part "A"; a schematic diagram of an energy diagram of the electrical coupling structure 102 using only the two-dimensional material layer 123 is illustrated as part "B"; and a schematic diagram of an energy diagram of the electrical coupling structure 100 according to the present embodiment is illustrated as part "C".

As illustrated in FIG. 3, in a case where the layer held between the semiconductor layer 110 and the metal layer 130 is only the insulating layer 121 (a case of part "A"), if the film thickness is as illustrated in (1), the semiconductor layer 110 and the metal layer 130 are directly bonded, and thus FLP occurs at the bonded interface of the semiconductor layer 110 and the metal layer 130. Therefore, if the film thickness is as illustrated in (1), the resistance between the semiconductor layer 110 and the metal layer 130 becomes high due to the Schottky barrier.

If the film thickness is as illustrated in (2), the film thickness of the layer lying between the semiconductor layer 110 and the metal layer 130 is thin, and thus it is not enough to unpin FLP at the bonded interface of the semiconductor layer 110 and the metal layer 130. Therefore, the resistance between the semiconductor layer 110 and the metal layer 130 remains relatively high due to the Schottky barrier.

If the film thickness is as illustrated in (3), the film thickness of the layer lying between the semiconductor layer 110 and the metal layer 130 is a film thickness appropriate for unpinning FLP at the bonded interface of the semiconductor layer 110 and the metal layer 130. Therefore, the wave function of electrons penetrating from the metal layer 130 does not reach the semiconductor layer 110, and thus FLP does not occur. Furthermore, the film thickness of the layer held between the semiconductor layer 110 and the metal layer 130 is sufficiently thin, thus a tunnel distance between the semiconductor layer 110 and the metal layer 130 is short, and it is possible to cause the tunnel current to flow. Accordingly, the resistance between the semiconductor layer 110 and the metal layer 130 may be reduced.

Here, if the film thickness is as illustrated in (4), the film thickness of the layer lying between the semiconductor layer 110 and the metal layer 130 is a film thickness appropriate for unpinning FLP at the bonded interface of the semiconductor layer 110 and the metal layer 130. Therefore, the wave function of electrons penetrating from the metal layer 130 does not reach the semiconductor layer 110, and thus FLP does not occur. However, in a case where the layer held between the semiconductor layer 110 and the metal layer 130 is the insulating layer 121 (the case of part "A"), with an increase in the film thickness of the insulating layer 121, the tunnel distance becomes longer, and the tunnel resistance becomes higher; therefore, the resistance between the semiconductor layer 110 and the metal layer 130 becomes high.

Meanwhile, in a case where the layer held between the semiconductor layer 110 and the metal layer 130 includes the two-dimensional material layer 123 (the case of part "B" or part "C"), with an increase in the film thickness of the two-dimensional material layer 123, the band gap of the two-dimensional material layer 123 becomes smaller, and a tunnel barrier of the two-dimensional material layer 123 becomes lower. A probability at which electrons tunnel through an ultrathin film such as the two-dimensional material layer 123 is exponentially proportional to the product of the tunnel distance and the height of the tunnel barrier. Thus, in the case where the two-dimensional material layer 123 is used (the case of part "B" or part "C"), an increase in the tunnel resistance associated with an increase in the film thickness is slower than in the case where only the insulating layer 121 is used (the case of part "A"); therefore, it is possible to suppress an increase in the resistance between the semiconductor layer 110 and the metal layer 130.

Therefore, in the case where the two-dimensional material layer 123 is provided between the semiconductor layer 110 and the metal layer 130, the tunnel barrier becomes lower due to the increase in the film thickness than in the case where only the insulating layer 121 is provided between the semiconductor layer 110 and the metal layer 130, and thus the electrical coupling structure makes it possible to cause the tunnel current to flow between the semiconductor layer 110 and the metal layer 130 even if it has a thicker film thickness.

It is to be noted that if the film thickness is as illustrated in (5), the film thickness of the layer lying between the semiconductor layer 110 and the metal layer 130 is sufficiently thick, and the tunnel distance becomes long. Thus, in both cases of the insulating layer 121 and the two-dimensional material layer 123, the tunnel resistance becomes high. Therefore, the resistance between the semiconductor layer 110 and the metal layer 130 becomes high.

That is, by balancing a decrease in the Schottky resistance associated with unpinning of FLP between the semiconductor layer 110 and the metal layer 130 and an increase in the tunnel resistance due to an increase in the film thickness of the layer held between the semiconductor layer 110 and the metal layer 130, it becomes possible to put the coupling structure of the semiconductor layer 110 and the metal layer 130 into the low resistance state.

In a graph illustrated in FIG. 3, "Sch" denotes a decrease in the Schottky resistance associated with unpinning of FLP between the semiconductor layer 110 and the metal layer 130; "Tins" denotes an increase in the tunnel resistance associated with an increase in the film thickness of the insulating layer 121 held between the semiconductor layer 110 and the metal layer 130; and "Ttmd" denotes an increase in the tunnel resistance associated with an increase in the film thickness of the two-dimensional material layer 123 held between the semiconductor layer 110 and the metal layer 130.

Referring to FIG. 3, "Ttmd" is slower in the increase in the resistance associated with the increase in the film thickness than "Tins", and thus a graph B of the sum of "Sch" and "Ttmd" is slower in the increase in the resistance associated with the increase in the film thickness than a graph A of the sum of "Sch" and "Tins". Therefore, the two-dimensional material layer 123 has a wider range of the film thickness that allows the coupling structure to go into the low resistance state when it lies between the semiconductor layer 110 and the metal layer 130, than the insulating layer 121.

The working mechanism of reducing the resistance between the semiconductor layer 110 and the metal layer 130 in the electrical coupling structure 100 according to the present embodiment is, as illustrated in part "C" of FIG. 3, similar to part "B" in the case where only the two-dimensional material layer 123 lies between the semiconductor layer 110 and the metal layer 130. However, in consideration of the strength of bonding of the two-dimensional material layer 123 and the semiconductor layer 110 and the metal layer 130, in the case where only the two-dimensional material layer 123 is formed between the semiconductor layer 110 and the metal layer 130, there is a possibility that the two-dimensional structure may not be formed appropriately, and the resistance may not be reduced. In the electrical coupling structure 100 according to the present embodiment, the insulating layer 121 and the two-dimensional material layer 123 are, as the intermediate layer 120, provided between the semiconductor layer 110 and the metal layer 130, thereby making it possible to reduce the resistance between the semiconductor layer 110 and the metal layer 130 more stably.

FIG. 4 illustrates a result confirmed through an actual simulation of the relationship between the film thickness of the layer held between the semiconductor layer and the metal layer and the resistance of the coupling structure schematically illustrated in the graph of FIG. 3. In FIG. 4, "A" denotes a simulation result of a coupling structure of bonded metal-insulator-semiconductor; and "B" denotes a simulation result of a coupling structure of bonded metal-two-dimensional material layer (TMD)-semiconductor. Furthermore, the horizontal axis of a graph of FIG. 4 indicates the film thickness of the insulator or the two-dimensional material layer in a relative scale, and the vertical axis of the graph of FIG. 4 indicates the resistivity in a logarithmic relative scale.

As illustrated in FIG. 4, also through the simulations, it is confirmed that the coupling structure of bonded metal-two-dimensional material layer (TMD)-semiconductor has a smaller increase in the resistance associated with an increase in the film thickness of the insulator or the two-dimensional material layer than the coupling structure of bonded metal-insulator-semiconductor. Therefore, it is understood that even in a case where the film thickness of the two-dimensional material layer is thicker, the coupling structure of the metal and the semiconductor through the two-dimensional material layer is able to achieve a lower resistance than the coupling structure of the metal and the semiconductor through the insulator.

2. Second Embodiment

Subsequently, a semiconductor device according to a second embodiment of the present disclosure is described with reference to FIGS. 5 to 9C. The semiconductor device according to the present embodiment is any of various semiconductor devices, such as various field effect transistors (FETs), a diode, a bipolar transistor, a solid-state imaging device, a storage device, and an arithmetic unit, that include the electrical coupling structure of the semiconductor layer 110 and the metal layer 130 described in the first embodiment.

For example, the semiconductor device according to the present embodiment may be any of various transistors such as a planar FET, a Fin FET, and a gate-all-around (GAA) FET, various diodes such as a rectifier diode, a photodiode, and a light-emitting diode, a pnp-type or an npn-type bipolar transistor, an image sensor, etc. that include the electrical coupling structure described in the first embodiment.

In the following, with a planar FET as an example of the semiconductor device according to the present embodiment, first and second structure examples are described.

(2.1. First Structure Example)

First, the semiconductor device according to the first structure example is described with reference to FIG. 5. FIG. 5 is a longitudinal cross-sectional view schematically illustrating a configuration of the semiconductor device according to the first structure example.

As illustrated in FIG. 5, the semiconductor device according to the first structure example includes a semiconductor substrate 200, a gate insulator 231, a gate electrode 230, a side wall 241, a source region 210S, a drain region 210D, an insulating layer 251, a two-dimensional material layer 253, an electrode 260, and an interlayer insulator 243. Here, the source region 210S or the drain region 210D formed on the semiconductor substrate 200, the insulating layer 251, the two-dimensional material layer 253, and the electrode 260 form the electrical coupling structure 100 according to the first embodiment.

It is to be noted that a "first conductivity type" described below represents either a "p-type" or an "n-type", and a "second conductivity type" represents the other type different from the "first conductivity type". That is, in a case where the "first conductivity type" is the "p-type", the "second conductivity type" is the "n-type". In a case where the "first conductivity type" is the "n-type", the "second conductivity type" is the "p-type".

The semiconductor substrate 200 is a substrate including an elemental semiconductor or a compound semiconductor. The semiconductor substrate 200 may be a substrate including, for example, a Group IV semiconductor such as Si or Ge. Alternatively, the semiconductor substrate 200 may be a substrate including a Group III-V compound such as GaAs, GaN, or InP, a Group IV compound semiconductor such as SiC or SiGe, or a Group II-VI semiconductor such as ZnSe, CdS, or ZnO. The semiconductor substrate 200 may be activated by being doped with a first conductivity type impurity (for example, a p-type impurity, such as boron (B) or aluminum (Al)).

The gate insulator 231 includes an insulating material and is provided on the semiconductor substrate 200. The gate insulator 231 may include, for example, an inorganic insulating material such as $SiO_x$ or $SiN_x$, or may include a high-dielectric material such as $HfO_x$. Furthermore, the gate insulator 231 may be a single-layer film, or may be a multi-layered film including multiple materials.

The gate electrode 230 includes a conductive material and is provided on the gate insulator 231. The gate electrode 230 may include poly-Si, or may include a metal material, such as W, Cu, Ti, Al, Pt, or Au, or a metal compound, such as TiN or TaN.

The side wall 241 is a side wall that includes an insulating material and is provided on respective side surfaces of the gate insulator 231 and the gate electrode 230 that project from a surface of the semiconductor substrate 200. Specifically, the side wall 241 may be formed by performing perpendicular anisotropic etching after an insulating film is deposited over the entire surface of the semiconductor substrate 200 with the gate electrode 230 formed thereon. For example, the side wall 241 may include an inorganic insulating material such as $SiO_x$ or $SiN_x$.

The side wall 241 serves as a mask that blocks a second conductivity type impurity when the semiconductor substrate 200 is doped with the second conductivity type impurity. By using the side wall 241, it becomes possible to form the source region 210S and the drain region 210D in a self-aligned manner.

The source region 210S and the drain region 210D are regions doped to have a second conductivity type, and are provided on both sides of the semiconductor substrate 200 opposed across the gate electrode 230. The source region 210S and the drain region 210D are able to be formed, for example, by a predetermined region of the semiconductor substrate 200 being doped with a second conductivity type impurity (for example, an n-type impurity such as phosphorus (P) or arsenic (As)).

It is to be noted that between the source region 210S and the drain region 210D and a region provided with the gate electrode 230, a ligtly doped drain (LDD) region with a second conductivity type impurity introduced thereinto at low concentration may be formed.

The interlayer insulator 243 includes an insulating material and is provided on the semiconductor substrate 200 to fill a region other than the region provided with the gate electrode 230. The interlayer insulator 243 electrically insulates respective wiring lines coupled to the gate electrode 230 and the electrode 260 from the semiconductor substrate 200, thereby enabling three-dimensional wiring coupling in the semiconductor device. The interlayer insulator 243 may include, for example, an inorganic insulating material such as $SiO_x$ or $SiN_x$.

The insulating layer 251 includes, as described above, an insulating oxide material. For example, the insulating layer 251 may be provided on the semiconductor substrate 200 along an inner wall of an opening provided on the interlayer insulator 243 to electrically couple the source region 210S or the drain region 210D and the electrode 260.

The two-dimensional material layer 253 includes, as described above, a two-dimensional material. For example, the two-dimensional material layer 253 may be provided on the insulating layer 251 along the inner wall of the opening provided on the interlayer insulator 243 to electrically couple the source region 210S or the drain region 210D and the electrode 260.

The electrode 260 is an electrode directed to taking out a signal or an electric current from the source region 210S or the drain region 210D. Specifically, the electrode 260 may be formed by filling, with a metal material, the opening provided on the interlayer insulator 243 to cause the source region 210S or the drain region 210D to be exposed. The electrode 260 may include, for example, a metal material, such as W, Cu, Ti, Al, Pt, or Au, or a metal compound, such as TiN or TaN.

In the semiconductor device according to the first structure example, a stacked structure of the source region 210S or the drain region 210D of the semiconductor substrate 200, the insulating layer 251, the two-dimensional material layer 253, and the electrode 260 may be formed by the electrical coupling structure 100 according to the first embodiment.

Subsequently, a method of manufacturing the semiconductor device according to the first structure example is described with reference to FIGS. 6A to 6E. FIGS. 6A to 6E are schematic longitudinal cross-sectional views that describe steps of manufacturing the semiconductor device according to the first structure example.

First, as illustrated in FIG. 6A, a field effect transistor is formed by means of a publicly known method, and filling with the interlayer insulator 243 is performed. For example, after the gate insulator 231 and the gate electrode 230 are deposited on the semiconductor substrate 200 doped to have a first conductivity type, the side wall 241 is formed. After that, with the gate electrode 230 and the side wall 241 as a mask, the semiconductor substrate 200 is doped with a second conductivity type impurity, and thereby the source region 210S and the drain region 210D are formed. Furthermore, the interlayer insulator 243 is formed on the source region 210S and the drain region 210D to fill a region other than the region provided with the gate electrode 230.

Then, as illustrated in FIG. 6B, openings 245 are formed on the interlayer insulator 243 to cause the source region 210S and the drain region 210D to be exposed. Specifically, dry etching is performed with a patterned mask, and thereby the openings 245 are formed on portions of the interlayer insulator 243.

After that, as illustrated in FIG. 6C, the insulating layer 251 and the two-dimensional material layer 253 are sequentially deposited over the entire surfaces of the interlayer insulator 243, including the openings 245, and the gate electrode 230. Specifically, by means of atomic layer deposition (ALD), the insulating layer 251 and the two-dimensional material layer 253 are each able to be uniformly formed into a thin film having a thickness of several nm. However, if uniform thin films are able to be formed on respective portions of the source region 210S and the drain region 210D that are exposed on the bottom of the openings 245, the insulating layer 251 and the two-dimensional material layer 253 may be formed by means of chemical vapor deposition (CVD), physical vapor deposition, or the like.

Next, as illustrated in FIG. 6D, the electrode 260 is formed. Specifically, a metal material is deposited on the two-dimensional material layer 253 to fill the openings 245 provided on the interlayer insulator 243, and thereby the electrode 260 is formed.

After that, as illustrated in FIG. 6E, a surface of the semiconductor device is planarized by means of chemical mechanical polishing (CMP) or the like. Specifically, the electrode 260, the two-dimensional material layer 253, and the insulating layer 251 are polished by means of CMP until the gate electrode 230 is exposed, and thereby the surface of the semiconductor device is planarized.

Through the above steps, the semiconductor device according to the present embodiment is able to be manufactured. It is to be noted that after the step of FIG. 6E, a wiring step is performed, and thereby electrical couplings of the gate electrode 230 and the electrode 260 and various wiring lines are formed.

Furthermore, modification examples of the semiconductor device according to the first structure example are described with reference to FIGS. 7A and 7B. FIG. 7A is a longitudinal cross-sectional view illustrating a modification example of the semiconductor device according to the first structure example, and FIG. 7B is a longitudinal cross-sectional view illustrating another modification example of the semiconductor device according to the first structure example.

For example, as illustrated in FIG. 7A, in the semiconductor device, a raised source region 211S and a raised drain region 211D may be formed on respective surfaces of the source region 210S and the drain region 210D. The raised source region 211S and the raised drain region 211D are formed, for example, by causing a semiconductor material such as Si or SiGe to epitaxially grow on the respective surfaces of the source region 210S and the drain region 210D. By forming the raised source region 211S and the raised drain region 211D, the semiconductor device illustrated in FIG. 7A makes it possible to suppress a short channel effect caused by miniaturization of a gate length.

In such a semiconductor device, a stacked structure of the raised source region 211S or the raised drain region 211D, the insulating layer 251, the two-dimensional material layer 253, and the electrode 260 may be formed by the electrical coupling structure 100 according to the first embodiment.

Alternatively, for example, as illustrated in FIG. 7B, in the semiconductor device, instead of the source region 210S and the drain region 210D, an embedded source region 213S and an embedded drain region 213D may be formed in the semiconductor substrate 200. The embedded source region 213S and the embedded drain region 213D are formed, for example, after regions corresponding to the source region 210S and the drain region 210D of the semiconductor substrate 200 are removed by etching, by filling the removed regions with a semiconductor material such as Si or SiGe and causing the semiconductor material to epitaxially grow. By forming the embedded source region 213S and the embedded drain region 213D, the semiconductor device illustrated in FIG. 7B makes it possible to suppress the short channel effect caused by miniaturization of the gate length.

In such a semiconductor device, a stacked structure of the embedded source region 213S or the embedded drain region 213D, the insulating layer 251, the two-dimensional material layer 253, and the electrode 260 may be formed by the electrical coupling structure 100 according to the first embodiment.

(2.2. Second Structure Example)

Subsequently, the semiconductor device according to the second structure example is described with reference to FIG. 8. FIG. 8 is a longitudinal cross-sectional view schematically illustrating a configuration of the semiconductor device according to the second structure example.

As illustrated in FIG. 8, the semiconductor device according to the second structure example includes the semiconductor substrate 200, the gate insulator 231, the gate electrode 230, the side wall 241, the source region 210S, the drain region 210D, the insulating layer 251, the two-dimensional material layer 253, the electrode 260, and the interlayer insulator 243. Here, the source region 210S or the drain region 210D formed on the semiconductor substrate 200, the insulating layer 251, the two-dimensional material layer 253, and the electrode 260 form the electrical coupling structure 100 according to the first embodiment.

In comparison with the semiconductor device according to the first structure example, the semiconductor device according to the second structure example differs only in the regions where the insulating layer 251 and the two-dimensional material layer 253 are formed, and its other configurations are substantially similar to those of the first structure example. Therefore, the regions where the insulating layer 251 and the two-dimensional material layer 253 are formed are described, and description of the other configurations is omitted here.

As illustrated in FIG. 8, the insulating layer 251 and the two-dimensional material layer 253 are provided on the source region 210S and the drain region 210D of the semiconductor substrate 200.

That is, in the semiconductor device according to the second structure example, the insulating layer 251 and the two-dimensional material layer 253 are formed on the semiconductor substrate 200 in advance, and, after the openings 245 are formed to cause the insulating layer 251 and the two-dimensional material layer 253 to be exposed, the electrode 260 is formed to fill the openings 245. Meanwhile, in the semiconductor device according to the first structure example, after the openings 245 are formed to cause the semiconductor substrate 200 to be exposed, the insulating layer 251 and the two-dimensional material layer 253 are formed inside each of the openings 245, and the electrode 260 is formed to fill the openings.

Also in the semiconductor device according to the second structure example, as with the semiconductor device according to the first structure example, the stacked structure of the source region 210S or the drain region 210D of the semiconductor substrate 200, the insulating layer 251, the two-dimensional material layer 253, and the electrode 260 may be formed by the electrical coupling structure 100 according to the first embodiment.

Subsequently, a method of manufacturing the semiconductor device according to the second structure example is described with reference to FIGS. 9A to 9C. FIGS. 9A to 9C are schematic longitudinal cross-sectional views that describe steps of manufacturing the semiconductor device according to the second structure example.

As illustrated in FIG. 9A, a field effect transistor is formed by means of a publicly known method, and deposition of the insulating layer 251 and the two-dimensional material layer 253 is performed. For example, after the gate insulator 231 and the gate electrode 230 are deposited on the semiconductor substrate 200 doped to have a first conductivity type, the side wall 241 is formed. After that, with the gate electrode 230 and the side wall 241 as a mask, the semiconductor substrate 200 is doped with a second conductivity type impurity, and thereby the source region 210S and the drain region 210D are formed. Furthermore, by means of ALD, the insulating layer 251 and the two-dimensional material layer 253 are sequentially formed on the source region 210S and the drain region 210D. It is to be noted that the insulating layer 251 and the two-dimensional material layer 253 may be formed by means of CVD, PVD, or the like.

Then, as illustrated in FIG. 9B, after the interlayer insulator 243 is deposited on the source region 210S and the drain region 210D, the openings 245 are formed on the interlayer insulator 243 to cause the two-dimensional material layer 253 to be exposed. Specifically, first, the interlayer insulator 243 is formed on the two-dimensional material layer 253 to fill a region other than the region provided with the gate electrode 230. After that, dry etching is performed with a patterned mask, and thereby the openings 245 are formed on portions of the interlayer insulator 243 to cause the two-dimensional material layer 253 to be exposed. It is to be noted that a so-called self-aligned contact (SAC) process may be applied to the formation of the openings 245.

After that, as illustrated in FIG. 9C, the electrode 260 is formed. Specifically, a metal material is deposited on the two-dimensional material layer 253 to fill the openings 245 provided on the interlayer insulator 243, and thereby the electrode 260 is formed. After that, the surface of the semiconductor device is planarized by means of CMP or the like. Specifically, the electrode 260 is polished by means of CMP until the gate electrode 230 is exposed, and thereby the surface of the semiconductor device is planarized.

Through the above steps, the semiconductor device according to the present embodiment is able to be manufactured. It is to be noted that after the step of FIG. 9C, the wiring step is performed, and thereby electrical couplings of the gate electrode 230 and the electrode 260 and various wiring lines are formed.

In the semiconductor device according to the first structure example, unlike in the second structure example, in the etching performed to form the openings 245, it is not necessary to control the etching precisely, and it does no damage to the two-dimensional material layer 253. Therefore, according to the first structure example, it is not necessary to consider the etch selectivity, etc., which makes it possible to expand the range of material options for each of the insulating layer 251, the two-dimensional material layer 253, and the interlayer insulator 243.

Meanwhile, in the semiconductor device according to the second structure example, unlike in the first structure example, the insulating layer 251 and the two-dimensional material layer 253 do not have to be deposited on the bottom of the openings 245. Therefore, according to the second structure example, it is not necessary to form a thin film inside the openings 245 each having a high aspect ratio, which makes it possible to increase the aspect ratio of the electrode 260.

3. Application Examples

The semiconductor device according to the second embodiment of the present disclosure is able to be applied to a semiconductor element in a circuit to be installed in various electronic apparatuses. Here, examples of the electronic apparatuses to which the semiconductor device according to the present embodiment is applicable are described with reference to FIGS. 10A to 10C. FIGS. 10A to 10C are appearance views of the examples of the electronic apparatuses to which the semiconductor device according to the present embodiment is applicable.

For example, the semiconductor device according to the present embodiment is able to be applied to a semiconductor element in a circuit installed in an electronic apparatus such as a smartphone. Specifically, as illustrated in FIG. 10A, a smartphone 900 includes a display section 901 that displays a variety of information and an operation section 903 that includes buttons, etc. and receives an operation input made by a user. Here, the semiconductor device according to the present embodiment may be applied to a semiconductor element in a control circuit that controls various operations of the smartphone 900.

For example, the semiconductor device according to the present embodiment is able to be applied to a semiconductor element in a circuit installed in an electronic apparatus such as a digital camera. Specifically, as illustrated in FIGS. 10B and 10C, a digital camera 910 includes a main body (a camera body) 911, an interchangeable lens unit 913, a grip section 915 that a user grips at the time of photographing, a monitor 917 that displays a variety of information, and an electronic viewfinder (EVF) 919 that displays a through image observed by the user at the time of photographing. It is to be noted that FIG. 10B is an appearance view of the digital camera 910 viewed from the front (i.e., the side of a photographic subject), and FIG. 10C is an appearance view of the digital camera 910 viewed from the back (i.e., the side of a photographer). Here, the semiconductor device according to the present embodiment may be applied to a semiconductor element in a control circuit that controls various operations of the digital camera 910.

It is to be noted that the electronic apparatuses to which the semiconductor device according to the present embodiment is applied are not limited to the above-described examples. The semiconductor device according to the present embodiment is able to be applied to a semiconductor element in a circuit to be installed in electronic apparatuses in all fields. Such electronic apparatuses may include, for example, a glasses-type wearable device, a head-mounted display (HMD), a television device, an electronic book, a personal digital assistant (PDA), a notebook personal computer, a video camera, a game console, etc.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in the present specification are merely illustrative or exemplified effects, and are not limitative. That is, the technology according to the present disclosure may achieve other effects that should be understood from description of the present specification by those skilled in the art, in addition to the above-described effects or instead of the above-described effects.

It is to be noted that the following configurations also fall under the technical scope of the present disclosure.

(1)

An electrical coupling structure including:

a semiconductor layer;

a metal layer; and an intermediate layer held between the semiconductor layer and the metal layer, the intermediate layer including an insulating layer provided on the semiconductor layer side and a two-dimensional material layer provided on the metal layer side.

(2)

The electrical coupling structure according to (1), in which the two-dimensional material layer includes a two-dimensional material having a layered structure in which unit layers each having a two-dimensional structure are stacked.

(3)

The electrical coupling structure according to (2), in which the number of the stacked unit layers of the two-dimensional material layer is one or more but not exceeding ten.

(4)

The electrical coupling structure according to any one of (1) to 3, in which the two-dimensional material layer has a film thickness of 0.5 nm or more but not exceeding 5.0 nm.

(5)

The electrical coupling structure according to any one of (1) to 4, in which the insulating layer has a film thickness of 0.1 nm or more but not exceeding 3.0 nm.

(6)

The electrical coupling structure according to any one of (1) to 5, in which the intermediate layer has a total film thickness of 0.6 nm or more but not exceeding 5.0 nm.

(7)

The electrical coupling structure according to any one of (1) to 6, in which the two-dimensional material layer includes a material represented by a chemical formula $MX_2$, where M is any of Sc, Ti, V, Cr, Mn, Fe, Co, Ni, Cu, Ge, Zr, Nb, Mo, Ru, Rh, Pd, Sn, Hf, Ta, W, Re, Os, Ir, Pt, Au, Hg, and Pb, and X is any of S, Se, and Te.

(8)

The electrical coupling structure according to (7), in which the material represented by the chemical formula $MX_2$ is any of $CrS_2$, $CrSe_2$, $CrTe_2$, $HfS_2$, $HfSe_2$, $HfTe_2$, $MoS_2$, $MoSe_2$, $MoTe_2$, $NiS_2$, $NiSe_2$, $SnS_2$, $SnSe_2$, $TiS_2$, $TiSe_2$, $TiTe_2$, $WS_2$, $WSe_2$, $ZrS_2$, $ZrSe_2$, and $ZrTe_2$.

(9)

The electrical coupling structure according to any one of (1) to (8), in which the insulating layer includes an oxide.

(10)

The electrical coupling structure according to (9), in which the oxide is a transition metal oxide.

(11)

A semiconductor device including a contact structure that electrically couples a semiconductor layer and a metal layer to each other, the contact structure including an intermediate layer held between the semiconductor layer and the metal layer, the intermediate layer including an insulating layer provided on the semiconductor layer side and a two-dimensional material layer provided on the metal layer side.

(12)

An electronic apparatus including a contact structure that electrically couples a semiconductor layer and a metal layer to each other, the contact structure including an intermediate layer held between the semiconductor layer and the metal layer, the intermediate layer including an insulating layer provided on the semiconductor layer side and a two-dimensional material layer provided on the metal layer side.

REFERENCE SIGNS LIST 100 electrical coupling structure
110 semiconductor layer
120 intermediate layer
121 insulating layer
123 two-dimensional material layer
130 metal layer
200 semiconductor substrate
210D drain region
210S source region
211D raised drain region
211S raised source region
213D embedded drain region
213S embedded source region
230 gate electrode
231 gate insulator
241 side wall
243 interlayer insulator
251 insulating layer
253 two-dimensional material layer
260 electrode

The invention claimed is:

1. An electrical coupling structure comprising:
an intermediate layer configured to electrically couple a semiconductor layer and a metal layer to each other, wherein:
the intermediate layer comprises an insulating layer and a two-dimensional material layer,
the two-dimensional material layer is between the metal layer and the insulating layer,
the insulating layer is between the semiconductor layer and the two-dimensional material layer, and
the intermediate layer has a total film thickness of 0.6 nm or more but not exceeding 5.0 nm.

2. The electrical coupling structure according to claim 1, wherein the semiconductor layer is a Group III-V compound semiconductor layer.

3. The electrical coupling structure according to claim 1, wherein the semiconductor layer is a Group IV compound semiconductor layer.

4. The electrical coupling structure according to claim 1, wherein the semiconductor layer is a Group II-VI compound semiconductor layer.

5. The electrical coupling structure according to claim 1, wherein an impurity of a conductivity type is in the semiconductor layer.

6. The electrical coupling structure according to claim 1, wherein the intermediate layer is configured to reduce a contact resistance between the metal and the semiconductor layer.

7. The electrical coupling structure according to claim 1, wherein the metal layer and the insulating layer are in physical contact with the two-dimensional material layer.

8. The electrical coupling structure according to claim 1, wherein the semiconductor layer and the two-dimensional material layer are in physical contact with the insulating layer.

9. The electrical coupling structure according to claim 1, wherein the two-dimensional material layer includes a material represented by a chemical formula $MX_2$.

10. The electrical coupling structure according to claim 9, wherein M is from the group consisting of Sc, Ti, V, Cr, Mn, Fe, Co, Ni, Cu, Ge, Zr, Nb, Mo, Ru, Rh, Pd, Sn, Hf, Ta, W, Re, Os, Ir, Pt, Au, Hg, and Pb.

11. The electrical coupling structure according to claim 9, wherein X is from the group consisting of S, Se, and Te.

12. The electrical coupling structure according to claim 9, wherein the material represented by the chemical formula $MX_2$ is any of $CrS_2$, $CrSe_2$, $CrTe_2$, $HfS_2$, $HfSe_2$, $HfTe_2$, $MoS_2$, $MoSe_2$, $MoTe_2$, $NiS_2$, $NiSe_2$, $SnS_2$, $SnSe_2$, $TiS_2$, $TiSe_2$, $TiTe_2$, $WS_2$, $WSe_2$, $ZrS_2$, $ZrSe_2$, and $ZrTe_2$.

13. The electrical coupling structure according to claim 1, wherein the two-dimensional material layer has a film thickness of 0.5 nm or more but not exceeding 5.0 nm.

14. The electrical coupling structure according to claim 13, wherein the two-dimensional material layer includes a two-dimensional material having a layered structure in which unit layers each having a two-dimensional structure are stacked.

15. The electrical coupling structure according to claim 14, wherein a number of the unit layers is one or more but not exceeding ten.

16. The electrical coupling structure according to claim 1, wherein the insulating layer includes an oxide.

17. The electrical coupling structure according to claim 16, wherein the oxide is a transition metal oxide.

18. The electrical coupling structure according to claim 1, wherein the insulating layer has a film thickness of 0.1 nm or more but not exceeding 3.0 nm.

19. A semiconductor device comprising:
the electrical coupling structure according to claim 1.
20. An electronic apparatus comprising:
the semiconductor device according to claim 19.

\* \* \* \* \*